Dec. 20, 1966 L. W. HACKLEY 3,293,010

PASSIVATED ALLOY DIODE

Filed Jan. 2, 1964 4 Sheets-Sheet 1

INVENTOR.
Lloyd W. Hackley

BY Mueller & Aichele

ATT'YS.

Dec. 20, 1966 L. W. HACKLEY 3,293,010

PASSIVATED ALLOY DIODE

Filed Jan. 2, 1964 4 Sheets-Sheet 2

INVENTOR.
Lloyd W. Hackley
BY
Mueller & Aichele
ATT'YS.

Dec. 20, 1966 L. W. HACKLEY 3,293,010

PASSIVATED ALLOY DIODE

Filed Jan. 2, 1964 4 Sheets-Sheet 3

INVENTOR.
Lloyd W. Hackley

BY Mueller & Aichele

ATT'YS.

Dec. 20, 1966 L. W. HACKLEY 3,293,010

PASSIVATED ALLOY DIODE

Filed Jan. 2, 1964 4 Sheets-Sheet 4

INVENTOR.
Lloyd W. Hackley

BY

ATT'YS.

United States Patent Office 3,293,010
Patented Dec. 20, 1966

3,293,010
PASSIVATED ALLOY DIODE
Lloyd W. Hackley, Phoenix, Ariz., assignor to Motorola, Inc., Franklin Park, Ill., a corporation of Illinois
Filed Jan. 2, 1964, Ser. No. 335,300
3 Claims. (Cl. 29—195)

This invention relates to semiconductor devices and particularly to a zener diode especially suited for low voltage application.

Low voltage zener diodes as presently available are either diffused junction devices or alloy junction devices.

Good graded junction devices, e.g., diffused junction devices, which have breakdown voltages below six volts are presently difficult to make. The most common difficulty is that such devices have excessively high leakage current in the reverse direction. The zener knee is not abrupt since breakdown begins to occur well before complete breakdown occurs.

Reasonably good alloy junction devices, however, can be made for zener diode used at very low voltages. But ordinary alloyed devices are difficult to passivate at the present state of the semiconductor art and consequently demonstrate a tendency to breakdown in localized areas at the surface rather than uniformly in the bulk. Surface breakdown is unreliable and somewhat limits the current handling ability of such devices since the high current density associated with localized breakdown frequently will overheat a region of a device and may destroy it.

Much to be desired is a passivated zener diode which breaks down sharply and reliably at the zener voltage. The need is greatest in the case of diodes with a zener voltage of 6 volts or less. The principal object of this invention is to provide such a diode.

The diode of this invention features a PN junction having an alloyed portion and a diffused portion so that the more desirable features of both types of junctions are present, and further having the diffused portion emerge from the semiconductor at a planar surface under a passivating coating.

A low voltage zener diode device which is an embodiment of this invention has in its active element a two part PN junction region which has a central alloyed part and a peripheral diffused part which is protected and passivated by a film of metallic oxide. A zener diode device with an active element of this type breaks down sharply at zener voltage, has extremely low current leakage, and is exceptionally stable and reliable. The embodiments discussed in the specification have alloyed P regions and diffused P regions in N type body material. It is intended that the scope of the invention also include the use of alloyed and diffused N region on P type body material. A complete zener diode device 11 of this type is shown in FIG. 1.

Figure 1:
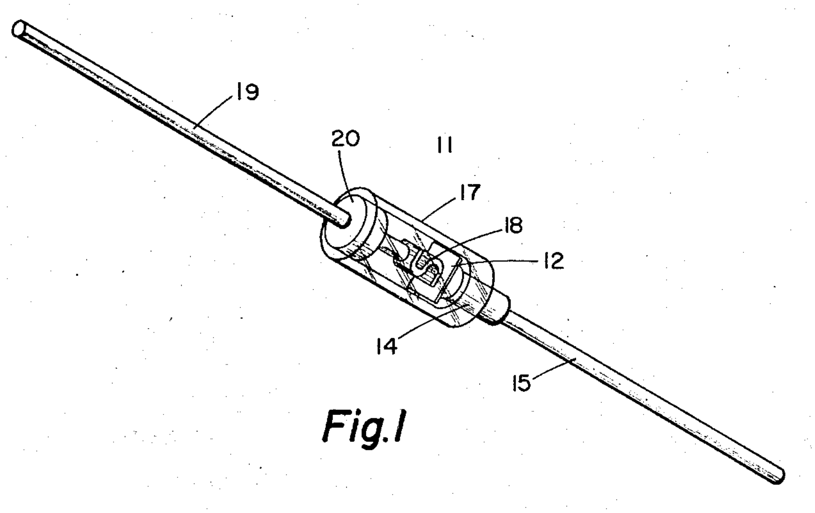
FIG. 1 is a view of a zener diode device in which the structure of the active element is in accordance with this invention.

A particular embodiment, which is shown several times oversize in cutaway view in FIG. 1 includes an active silicon element 12 within a glass envelope. The active silicon element 12 is connected electrically and mechanically with solder to the enlarged portion 14 of the lower lead 15. This enlarged portion of the lead and the glass cylinder 17 are sealed together along the length of the enlarged portion 14. Connection to an aluminum electrode on the upper side of the active element is made with the S-bend portion 18 of the lead assembly which presses against the aluminum electrode on the active element 12. The lead assembly itself is a unit consisting of an S-bend portion 18, a lead 19, and a bead of glass 20 sealed about the lead 19. The glass bead 20 is also fused to the glass cylinder 17 to hermetically seal the device.

In the isometric view of the active element 12 alone (FIG. 2) are shown the silicon body material 23, the metal regions which are the upper electrode 25 and the lower electrode 26, and the oxide film 28 which serves to protect the diffused PN junction. The junction geometry of the embodiments of the active element shown are essentially circular; however, it is possible to use any shape that closes on itself such as a square or rectangle.

Figure 2:
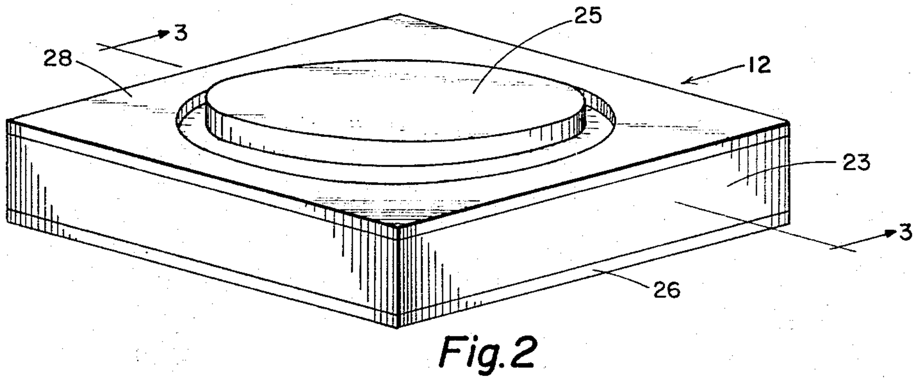
FIG. 2 is an isometric view of the active element.

The cross sectional view (FIG. 3) of the active element 12 taken at line 3—3 of FIG. 2 shows the junction arrangement. The alloyed semiconductor material, i.e., the P type silicon regrowth 30, formed during an alloying operation of the aluminum electrode 25 forms a PN junction 33 with the N type silicon body material 23. The outer edges of the P type regrowth 30 everywhere lie in another region 35 of P type silicon. This region 35 is of diffused semiconductor material; it was formed by selective solid state diffusion and is in the form of an annular ring generally concentric with the regrowth region 30. This region 35, although it forms with the N type body material a PN junction 36 extending to the surface of the silicon, will not undergo avalanche breakdown under increasing reverse bias, but rather breakdown will occur across the alloyed PN junction 33. This is due to the basic nature of diffused and alloy junctions. When diffused and alloyed junctions are formed on a common substrate, the alloyed junction will have a lower breakdown voltage than the diffused junction. In this embodiment the alloyed junction breaks down about 2 to 5 volts less than the diffused junction would if it were there without the alloyed junction being present. This phenomena is well known in the art, and is relied on for example in the device described in U.S. Patents No. 2,959,505 and 2,992,471. Since the device of FIG. 3 herein breaks down across the alloyed junction rather than the diffused junction, the device has the sharp breakdown associated with alloyed junctions.

The oxide film 28 extending over the PN junction at the silicon surface prevents exposure of the surface PN junction to the ambient atmosphere, keeps it clean during assembly, and reduces the electric field across the junction at the surface. This results in a diode relatively immune to the possible drift and degradation resulting from contamination and surface effects and additionally results in lower current leakage across the junction.

Figure 3:
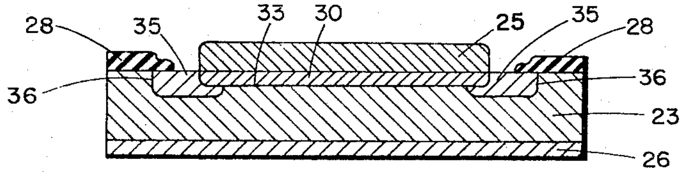
FIG. 3 shows a cross sectional view of the active element of FIG. 2.
Figure 4:
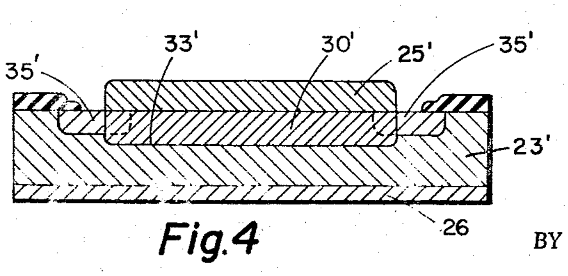
FIG. 4 shows an alternative active element.

An alternative structure is shown in FIG. 4. It differs from FIG. 3 only in that the alloyed region 30′ penetrates deeper into the semiconductor element 23′. The aluminum metal was alloyed through the open center of the annular diffused region 35′ to form the junction face 33′ beneath the deepest part of the diffused region 35′. This structure, while slightly less easy to manufacture, as the deeper alloying necessary to penetrate beyond the annular diffused region results in a slight reduction in reproducibility, employs the advantages of the structure of the active element shown in FIG. 3 and has a slight additional advantage in that, for a given surface geometry, the area of the abrupt junction 33′ (FIG. 4) is somewhat greater than the area of the abrupt junction 33 (FIG. 3). Under the same operating conditions, the structure of FIG. 4 is better equipped to handle power surges since the current density across the larger junction will be less.

FIG. 5 shows sequentially the steps in the preparation of the active element shown in FIG. 3 as it is presently being made.

Figure 5A:
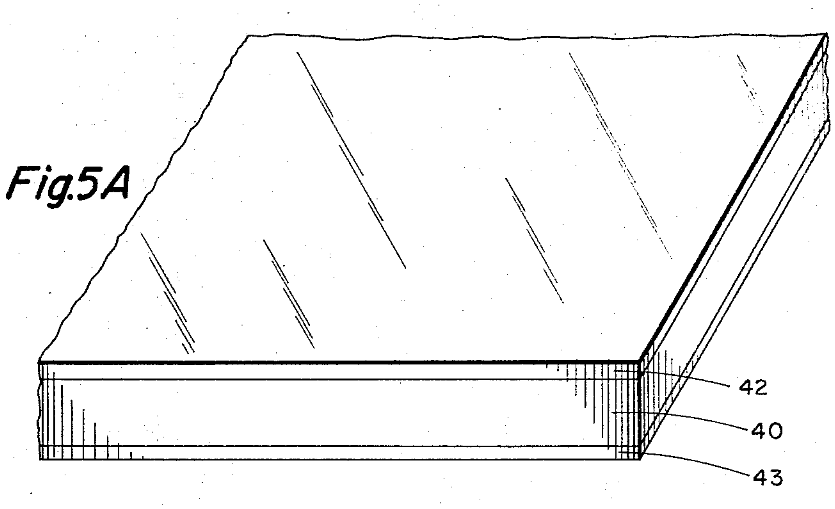
FIGS. 5A to 5J show the sequence of steps used in preparing the active element of FIG. 2.

A wafer 40 of N type silicon in the resistivity range 0.007 ohm-centimeter to 0.08 ohm-centimeter and about 7 mils thick, is thermally oxidized to form a film 42 and 43 of $SiO_2$ about 15,000 angstrom units thick over each face (FIG. 5A). With a starting resistivity of 0.08 ohm-centimeter the finished device will have a zener voltage of about 12 volts, a resistivity of .007 ohm-centimeter will provide a zener voltage of about 3 volts.

Figure 5B:
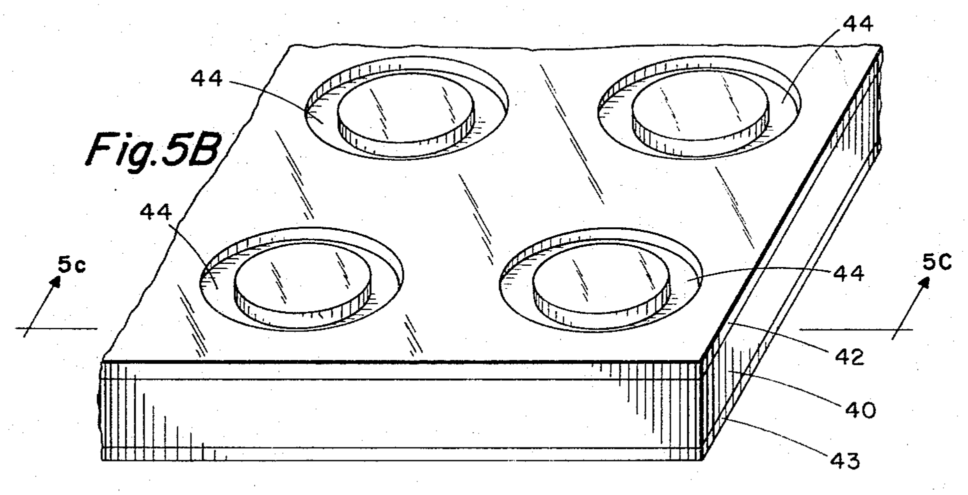
Figure 5C:
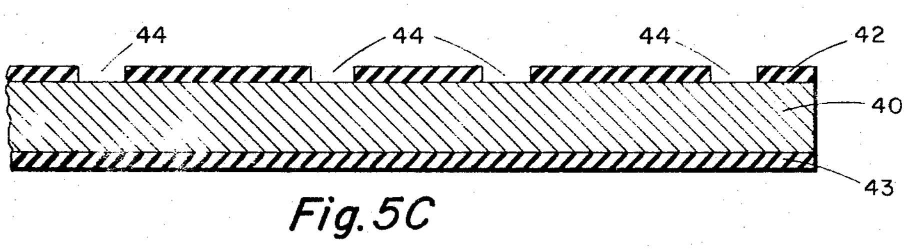
Figure 5D:
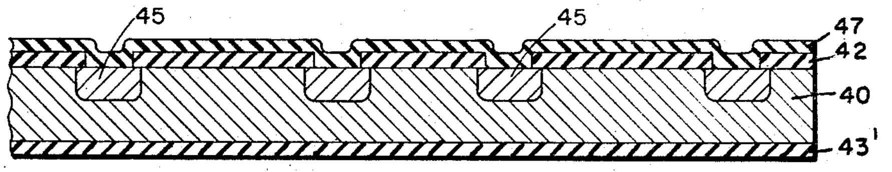

Using photoresist techniques, a plurality of annular openings 44 having an inner diameter of about .024 inch and an outer diameter of about .030 inch and concentric with the inner diameter, are made in the silicon dioxide film 42 (FIGS. 5B and 5C). In a solid state diffusion step, the wafer is exposed to boron trioxide and an oxidizing atmosphere to form the P type regions 45 (FIG. 5D) and an additional thickness of oxide 47 which covers the region of the previous annular opening (FIG. 5D). For purposes of illustration, this region is shown as being discrete from the original oxide 42 although a well defined boundry does not exist.

The depth of the P region 45 is of the order of about 2 microns with a surface concentration of uncompensated boron of about $2\times10^{19}$; the additional thickness of the oxide is of the order of about 8000 angstrom units in thickness.

Next the wafer may be exposed to a gettering treatment, which is optional, to remove undesirable metallic impurities such as copper from the crystalline material. Such procedures are well-known, a particularly useful one being that of stripping the oxide from the N side of the wafer and heating it to a temperature of about 1100° C. in the presence of oxygen and phosphorus pentoxide ($P_2O_5$) vapor for about one-half hour. The wafer is then exposed to water vapor at about 900° C. for an hour. The former treatment not only getters impurity but forms a region of reduced resistivity which will provide, in the finished device, a somewhat lower voltage drop across the device. The oxide 43 is replaced with a new oxide film 43' in this operation.

Figure 5E:
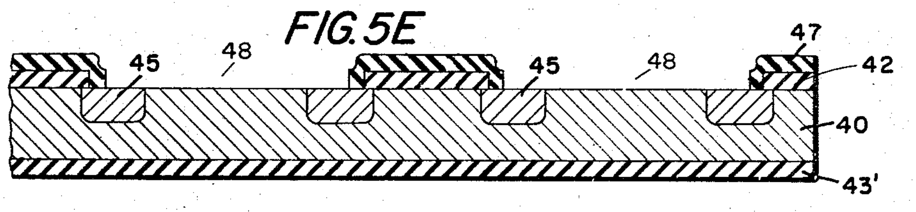
Figure 5F:
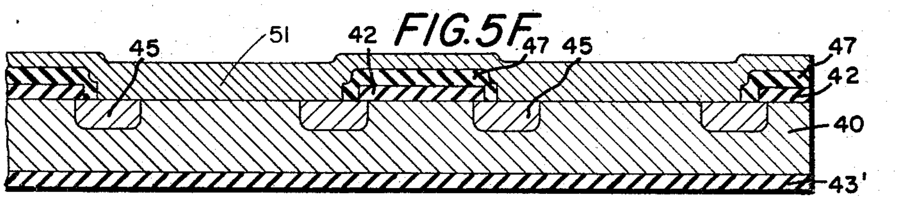
Figure 5G:
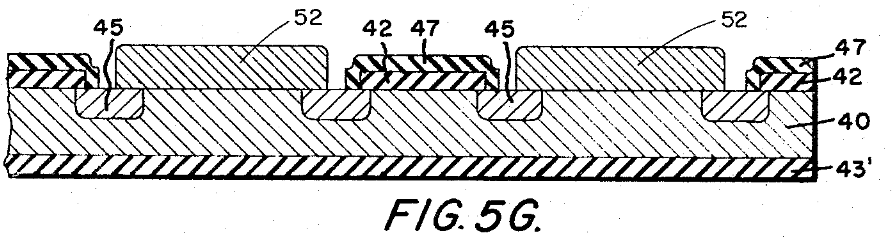

Following the gettering treatment, a photo-resist and etching operation is used to prepare circular openings 48 of about .028 inch in diameter in the oxide film 42, 47 at the upper surface of the wafer (FIG. 5E). An opening 48 is made concentric with each diffused annular portion so that the oxide 42 covering the outer surface of PN junction is not removed.

Figure 5H:
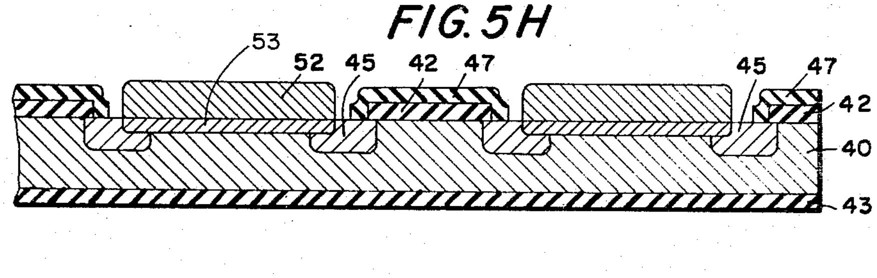
Figure 5I:
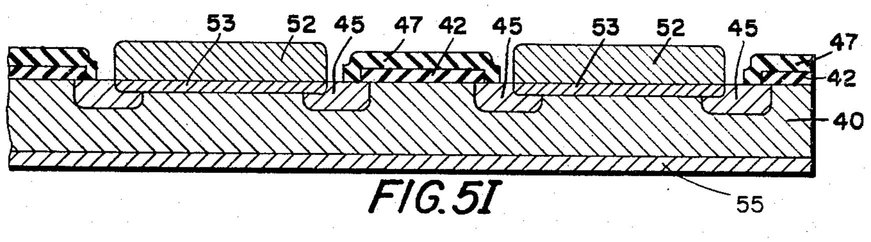
Figure 5J:
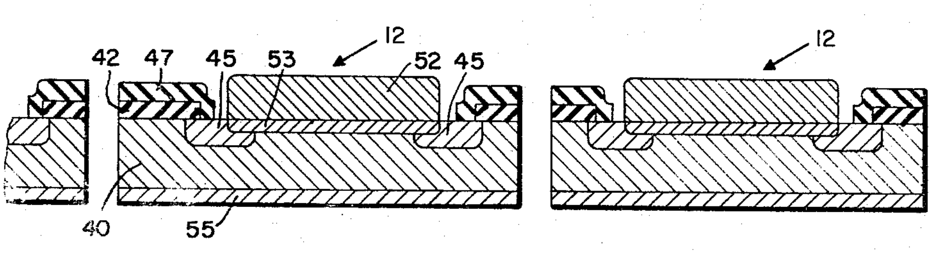

A film of aluminum 51 of about 20,000 angstrom units in thickness is evaporated over the surface of the wafer (FIG. 5F) and then etched using photo-resist techniques to leave aluminum disks 52 (FIG. 5G) about .026 inch in diameter in each opening 48. In order to alloy the aluminum disks 52 with the silicon wafer 40, the wafer is then heated to a temperature of about 900° C. in a nitrogen and hydrogen atmosphere and cooled to form the P type silicon regrowth regions 53 (FIG. 5H). (The alternate structure of FIG. 4 requires a film of aluminum of about 40,000 angstrom units in thickness and a temperature of at least 1000° C. so that the regrowth region 30' will penetrate deeper than the annular diffused region 35.) The oxide is removed from the lower face of the wafer (FIG. 5I) and gold and silver are evaporated on this face using vacuum technique to form a thin film 55 of a golf-silver mixture (FIG. 5I). This is then alloyed with the silicon and cooled. The ternary alloy system of silicon-gold-silver has a eutectic temperature well below that of the aluminum-silicon binary so that the alloying of the golf-silver with the silicon is accomplished without affecting the regrowth region 53.

The wafers are then cut into small square active elements 12 about .040 inch on a side (FIG. 5J) and mounted and enclosed within glass to complete the assembly of the device in the form shown in FIG. 1.

The following table of typical characteristics (Table I) compares diffused junction zener diodes with zener diodes which are embodiments of this invention. The two types are each one-half watt zener diodes, similarly mounted and enclosed. A zener voltage $V_Z$ of 6.2 volts at a test current of $I_{ZT}$ of 20 milliamperes was chosen since very low voltage (e.g., 3 volts) diffused units are not available. Each diode type has a forward voltage $V_F$ of 0.9 volt at a forward current $I_F$ of 200 milliamperes.

TABLE I

| Type | Max. zener Impedance (ohms) $Z_{ZT}$ at $I_{ZT}$ | Reverse Leakage Current (microamperes) $I_R$ at 4.8 volts |
|---|---|---|
| Diffused | 4 | 50 |
| Embodiment of Fig. 3 | 2 | 1 |

For the measurement of $Z_{ZT}$, an alternating current of 2 milliamperes (10%) is superimposed on the 20 milliamperes direct current ($I_{ZT}$) that passes through the diode.

The diode design of this invention not only makes possible good devices for lower voltage zener application than previously possible but in the low voltage range (e.g., 6 to 12 volts) where diffused zener diodes are available, diodes in accordance with this invention are markedly superior as indicated in Table I.

What is claimed is:

1. In a semiconductor diode device, a semiconductor element of semiconductor material selected from the group consisting of germanium and silicon and having opposed first and second sides, the surfaces of said sides being substantially plane and parallel, said semiconductor element comprising first and second regions of semiconductor material of P conductivity type on said first side of said wafer, said first region of alloy regrowth semiconductor material, doped P type with an impurity selected from the group consisting of boron, aluminum, gallium, or indium, said second region of semiconductor material made P type by solid state diffusion of an impurity selected from the group consisting of boron, aluminum, gallium, and indium into said semiconductor material, said first region bounded by said second region at said first side, a third region of the opposite conductivity type forming an abrupt PN junction with said first region, said third region forming a graded PN junction with said second region, said graded PN junction extending to the surface of said first side of said semiconductor element, said graded junction coated at said surface of said first side with a film of metallic oxide dielectric material, said graded junction having a higher avalanche breakdown characteristic than said abrupt junction, and a metal coating on said first region on said first side, and a metal coating on said third region on said second side.

2. In a semiconductor diode device, a silicon semiconductor element having opposed first and second sides, and the surfaces of said sides being substantially plane and parallel, said silicon semiconductor element comprising first and second regions of semiconductor material of P conductivity type on said first side of said wafer, said first region of alloy regrowth silicon material, doped P type with aluminum, said second region of boron diffused P type silicon material, said first region bounded by said second region at said first side, a third region of the opposite conductivity type forming an abrupt PN junction with said first region, said third region forming a graded PN junction with said second region, said graded PN junction extending to the surface of said first side of said semiconductor element, said graded junction coated at said surface of said first side with a film of metallic oxide dielectric material, said graded junction having a higher avalanche breakdown characteristic than said abrupt junction, a metal coating on said first region on said first side, and a metal coating on said third region on said second side.

3. In a semiconductor diode device, a semiconductor element of semiconductor material selected from the group consisting of germanium and silicon and having opposed first and second sides, the surfaces of said sides being substantially plane and parallel, said semiconductor element comprising first and second regions of semiconductor material of the same predetermined conductivity type on said first side of said wafer, said first region of alloy regrowth semiconductor material, said second region of said semiconductor material made by solid state diffusion, said first region being bounded by said second region at said first side, a third region of opposite conductivity type to said first and second regions forming an abrupt PN junction with said first region, said third region forming a graded PN junction with said second region, said graded PN junction extending to the surface of said first side of said semiconductor element, said graded junction coated at said surface of said first side with a film of metallic oxide dielectric material, said graded junction having a higher avalanche breakdown characteristic than said abrupt junction, a metal coating on said first region on said first side, and a metal coating on said third region on said second side.

References Cited by the Examiner

UNITED STATES PATENTS

| | | | |
|---|---|---|---|
| 2,816,850 | 12/1957 | Haring | 148—33.5 |
| 2,819,191 | 1/1958 | Fuller | 148—1.5 |
| 2,842,466 | 7/1958 | Moyer | 148—1.5 |
| 2,861,909 | 11/1958 | Ellis | 148—186 |
| 2,868,683 | 1/1959 | Jochems et al. | 148—33.5 |
| 2,959,505 | 11/1960 | Riesz | 148—33.5 |
| 2,967,793 | 1/1961 | Philips | 148—33.5 |
| 3,124,493 | 3/1964 | Matlow | 148—33 |
| 3,180,766 | 4/1965 | Williams | 148—33 |
| 3,183,129 | 5/1965 | Tripp | 148—33 |

HYLAND BIZOT, *Primary Examiner.*